United States Patent
How et al.

(10) Patent No.: US 6,242,767 B1
(45) Date of Patent: Jun. 5, 2001

(54) ASIC ROUTING ARCHITECTURE

(75) Inventors: Dana How, Palo Alto; Adi Srinivasan, Fremont; Abbas El Gamal, Palo Alto, all of CA (US)

(73) Assignee: LightSpeed Semiconductor Corp., Sunnyvale, CA (US)

( * ) Notice: Subject to any disclaimer, the term of this patent is extended or adjusted under 35 U.S.C. 154(b) by 0 days.

(21) Appl. No.: 08/966,946

(22) Filed: Nov. 10, 1997

(51) Int. Cl.$^7$ .................................................. H01L 27/10
(52) U.S. Cl. ..................... 257/202; 257/207; 257/208; 257/209; 257/211
(58) Field of Search ..................... 257/207, 202, 257/208, 209, 211, 776, 529; 438/128–132

(56) References Cited

U.S. PATENT DOCUMENTS

| | | | |
|---|---|---|---|
| Re. 34,363 | 8/1993 | Freeman | 307/465 |
| 4,161,662 | 7/1979 | Malcolm et al. | 307/213 |
| 4,197,555 | 4/1980 | Uehara et al. | 357/70 |
| 4,568,961 | 2/1986 | Noto | 357/45 |
| 4,642,487 | 2/1987 | Carter | 307/465 |
| 4,682,201 | 7/1987 | Lipp | 357/42 |
| 4,745,084 | 5/1988 | Rowson et al. | 437/51 |
| 4,748,494 * | 5/1988 | Yamada et al. | 257/207 |
| 4,851,892 * | 7/1989 | Anderson et al. | 257/209 |
| 4,870,302 | 9/1989 | Freeman | 307/465 |
| 4,873,459 | 10/1989 | El Gamal et al. | 307/465 |
| 4,875,971 | 10/1989 | Orbach et al. | 156/644 |
| 4,943,841 | 7/1990 | Yahara | 357/45 |
| 5,016,080 | 5/1991 | Giannella | 357/45 |
| 5,023,701 | 6/1991 | Sharpe-Geisler | 357/71 |
| 5,049,969 | 9/1991 | Orbach et al. | 357/51 |
| 5,073,729 | 12/1991 | Greene et al. | 307/465 |
| 5,084,404 | 1/1992 | Sharpe-Geisler | 437/51 |
| 5,087,589 | 2/1992 | Chapman et al. | 437/195 |
| 5,172,014 | 12/1992 | El Ayat et al. | 307/465 |
| 5,206,184 | 4/1993 | Allen et al. | 437/51 |
| 5,309,015 * | 5/1994 | Kuwata et al. | 257/207 |
| 5,338,970 * | 8/1994 | Boyle et al. | 257/207 |
| 5,404,033 | 4/1995 | Wong et al. | 257/202 |
| 5,506,162 | 4/1996 | Hirose et al. | 437/51 |
| 5,565,758 | 10/1996 | Yoeli et al. | 326/41 |
| 5,619,062 | 4/1997 | Janai et al. | 357/529 |
| 5,679,967 * | 10/1997 | Janai et al. | 257/529 |
| 5,847,420 * | 12/1998 | Kuge et al. | 257/208 |
| 5,861,641 | 1/1999 | Yoeli et al. | 257/211 |

FOREIGN PATENT DOCUMENTS

| | | | |
|---|---|---|---|
| 3408747 | 9/1984 | (DE) | H01L/23/52 |
| 000279387 | 6/1990 | (DE) . | |
| 0408060 | 1/1991 | (EP) | H01L/23/525 |
| 0681329 | 11/1995 | (EP) | H01L/23/538 |
| 7211767 | 12/1982 | (JP) . | |
| 1266742 | 10/1989 | (JP) . | |
| 3283663 | 12/1991 | (JP) . | |
| 4152567 | 5/1992 | (JP) . | |
| 6077427 | 3/1994 | (JP) . | |
| WO 93/10561 | 5/1993 | (WO) . | |

* cited by examiner

Primary Examiner—Sara Crane
(74) Attorney, Agent, or Firm—Fliesler Dubb Meyer & Lovejoy LLP

(57) ABSTRACT

A customizable ASIC routing architecture is provided. The architecture utilizes the uppermost metal layers of an ASIC composed of an array of function blocks for routing among function blocks while lower layers are used for local interconnections within the function blocks. The second-to-uppermost metal layer is fixed and generally includes a plurality of parallel segmented conductors extending in a first direction. The uppermost metal layer is customizable in a predesignated manner. Metal in the uppermost metal layer is selectively placed in tracks, which are substantially perpendicular to the segmented conductors in the layer below. Vias are provided between the two uppermost layers. One embodiment of the invention permits one-mask customization of an ASIC.

35 Claims, 14 Drawing Sheets

FIG. 1 -- PRIOR ART --

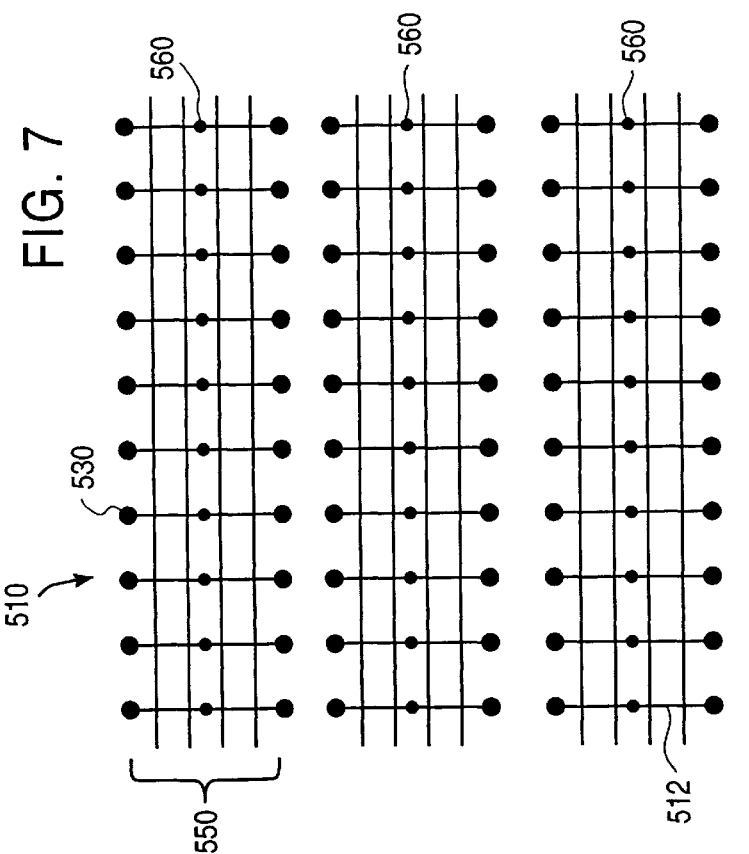
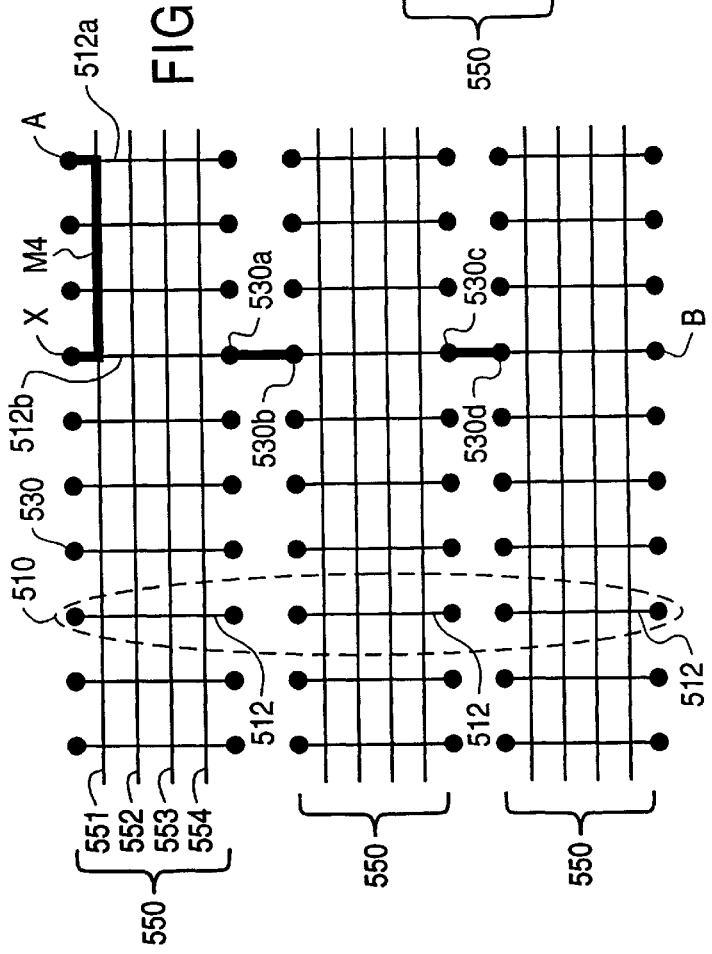
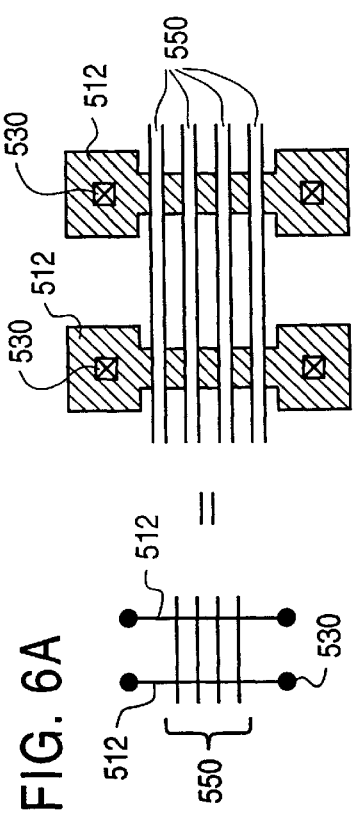

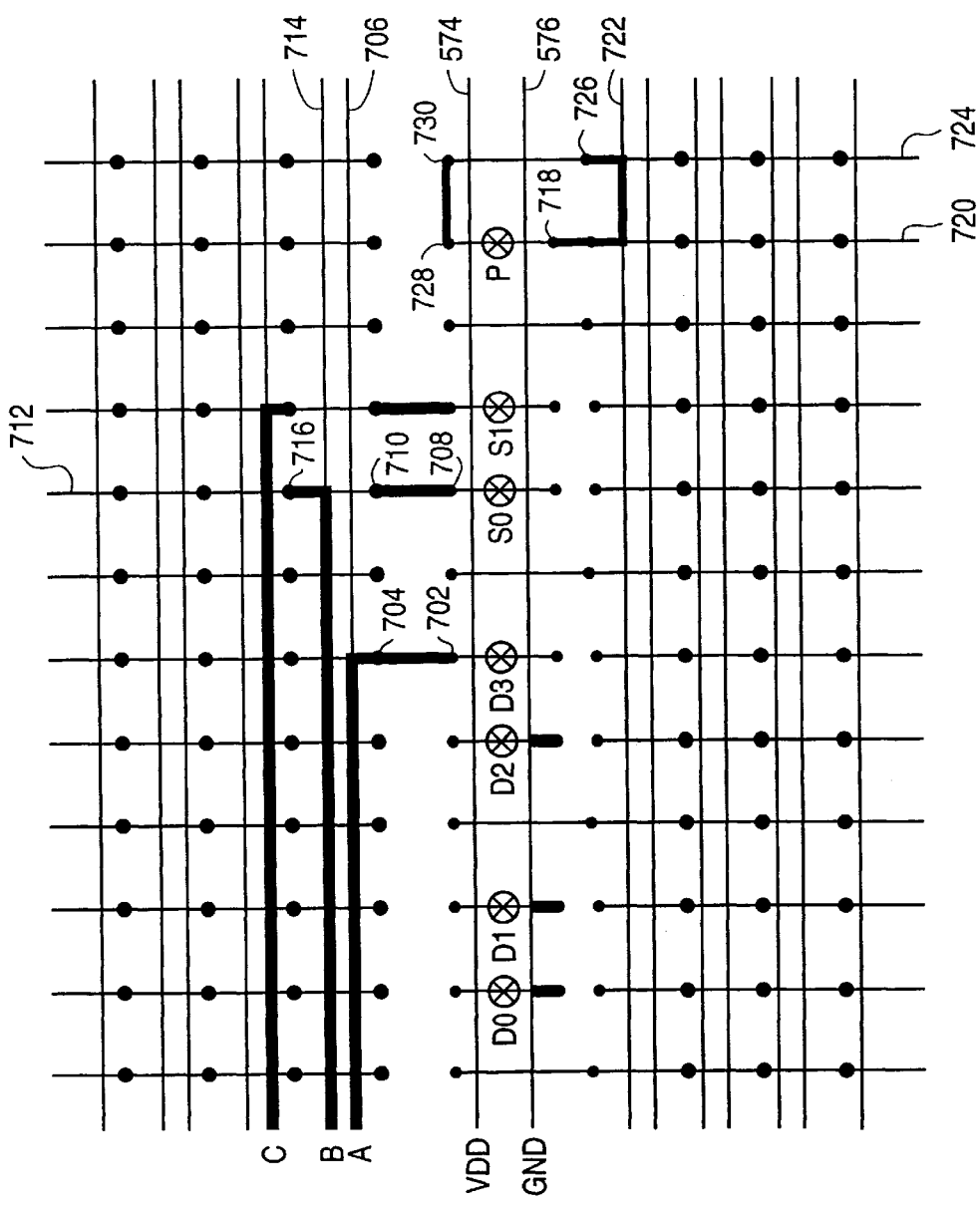
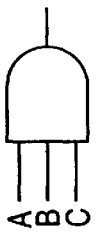
FIG. 12a
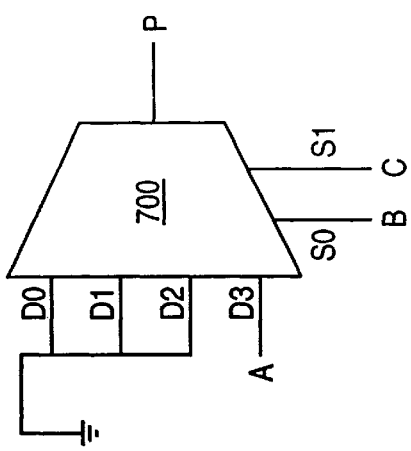
FIG. 12b
FIG. 12c

ASIC ROUTING ARCHITECTURE

FIELD OF INVENTION

The present invention generally relates to integrated circuits, and more specifically, to a routing architecture for interconnecting various IC devices to form a customized circuit.

BACKGROUND OF THE INVENTION

ASICs are widely used by electrical design engineers to include specialized circuitry in their designs using only a single chip. The term "ASIC" actually refers to a variety of integrated circuit (IC) styles that vary in degree of customizability, including standard cells, which are completely customizable, and gate arrays, which are partially customizable. As a general rule, the more customization that is required, the more expensive the ASIC will be and the longer the ASIC will take to fabricate and/or customize.

In forming ASICs generally, several layers will be required. FIG. 1 shows a cross-sectional view of a generic integrated circuit. First, active layers are formed on a semiconductor substrate. The active layers 110 include devices such as transistors and diodes. Most active layer devices are formed independently of one another, i.e., they are not connected to form a circuit. Thus, once active layers 110 are formed, metal layers are formed over the active layers to interconnect the devices, thereby forming a circuit. Several metal layers may be required to completely interconnect the devices to form a useful circuit. Four metal layers, M1 120, M2 130, M3 140 and M4 150, are shown in FIG. 1. Of course, different types of ICs may require more or less than four metal layers for circuit interconnection.

In between each metal layer is an insulating layer 115, 125, 135, 145 as shown in FIG. 1. Insulating layers are present to prevent shorts between metal layers. To interconnect the metal layers, vias 116 are formed through the insulating layers.

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using ultra-violet light, enabling removal of only selected portions of the photoresist, and then etching the insulating layer in accordance with the photoresist pattern. After forming the vias, a metal layer is deposited and then patterned using a similar masking process, so that metal remains only in desired locations. The process is repeated for each insulating layer and metal layer required to be formed.

Thus each metal layer required to be formed generally demands at least two masking steps: one step to form vias through the insulating layer to connect to the layer below and one step to form connection wires or lines. Unfortunately, each mask step required generally entails significant time and expense.

At the active layer level, ASIC active devices are generally arranged to form an array of function blocks, also commonly referred to as cells or modules. To interconnect active devices within each function block (i.e., form "local interconnections") a series of horizontal and vertical connection lines formed in the metal layers are utilized. As is well understood in the art, any two points can be connected using a series of horizontal and vertical connection lines. While such local interconnections can be done in one metal layer, more typically, horizontal connections are formed in a first metal layer (M1) 120 and vertical connections are formed in a second metal layer (M2) 130 with an insulating layer 125 having vias 116 formed between M1 and M2.

As should be understood and as used herein, "horizontal" is meant to describe all metal lines running in a first direction such that all horizontal lines lie substantially parallel to one another. "Vertical" is meant to convey all lines that run in a second direction which is substantially perpendicular to the first (horizontal) direction. Neither "horizontal" nor "vertical" is meant to convey anything more specific than relative position to one another. Moreover, as should be understood by those of skill in the art, horizontal lines and vertical lines are formed in the metal layers which are parallel to the active layer surface. "Horizontal" and "vertical" do not convey lines that are perpendicular to the active layer surface.

The local interconnections within each function block described above are typically quite dense, and often function blocks themselves must be connected together (i.e., circuit "routing"). Yet routing in lower metal layers over function blocks is often impractical due to the large number of obstructions formed by the local interconnections in those lower layers. Therefore, in order to form connections between the function blocks, routing has typically been done "around" the function blocks and will be discussed below with respect to FIGS. 2–3.

The Channeled Approach

One function block routing solution is shown in FIG. 2, showing a generalized plan view of a standard cell-type ASIC. As shown, in a standard cell, each function block 160 (160a–160i) will have a unique number and arrangement of active devices and will thus vary in horizontal size with respect to one another (although they are typically structured to have the same vertical height). Function blocks 160 are shown with dashed lines to indicate their conceptual formation in active layers 110. As discussed above and as shown in function block 160d, local interconnections within each function block are typically formed by horizontal lines in M1, e.g., 174, 176, and vertical lines in M2, e.g., 178. The horizontal and vertical lines are connected in their respective layers by vias, shown as "dots." Vias may not only connect M1 and M2 to each other but may also connect M1 and/or M2 to an active layer.

The function blocks 160 are further formed into rows 170a, 170b, 170c. Each row is separated from one another by a "channel" region 172a, 172b. The channel region is then used for horizontal routing between function blocks to avoid routing over the function block space. For instance, referring to FIG. 2, channel lines 180–182 and 184–186 are formed in channels 172a and 172b, respectively, using M1. Vertical lines 190–199 are formed in M2. Vertical lines 190–193 are used to couple the active devices in function block 160d to channel lines. The channel lines in turn are further connected (in M2) to other function blocks, e.g., with vertical lines 194–199. As shown, the channel lines can run the entire length of the channel or can run for a short distance within the channel.

Vias in the function block are connected to channel lines with connector lines that enter from above the function block, e.g., line 192, from below the function block, e.g., line 193, or double entry (connected from above and below), e.g., lines 190, 191. Lines could also simply "feed-through" the function block with no connection to a via; however, feed-throughs are often impractical because of dense local interconnections within the function blocks, limiting routing flexibility.

Gate arrays, like standard cells, have also used an approach as described above with reference to FIG. 2. That is, gate arrays have also been fabricated with channels to use for routing between function blocks. In gate arrays, however, the active layers are fixed (non-customizable), having a predefined number and arrangement of active devices in each function block. Thus, while fully-customizable standard cells can customize channel size larger or smaller, in gate arrays the channel size is fixed, further limiting routing flexibility.

In summary, the "channel" technique described with respect to FIG. 2, conventionally does all routing among function blocks in the channel regions. The only M1 metal outside of each function block (i.e., not used for local interconnections) is located in the channel regions, between rows of function blocks.

The Channel-less Approach

Another approach often used for routing interconnections among gate array function blocks and described with reference to FIG. 3 is a "channel-less" approach. Each function block 302 (302a–302i) is substantially contiguous to adjoining function blocks on each side—in other words, no routing channels are formed. Using substantially contiguous function blocks can increase the functionality available per IC since no fixed space is wasted for channels. Like the "channeled" approach, local interconnections within each function block are still typically formed with horizontal and vertical connections using M1 and M2, respectively, such as shown in function block 302g. Nonetheless, routing among function blocks is still restricted in that routing lines cannot always cross over the used function block space due to the local interconnect density. Therefore, typically in the channel-less structure of FIG. 3 routing is also done over selectively unused function blocks. Occasionally, even whole rows of function blocks are selectively unused in order to allow routing much like a channeled device, although more commonly only individual function blocks are selected to be reserved for routing, e.g., function blocks 302d and 302e.

The Time-Space Factors

Because of limitations in the metalization process, typically only a few metal layers have been used for routing conventionally. Nonetheless, recent developments in metalization and planarization technologies, particularly in the area of chemical-mechanical polishing (CMP), have allowed more metal layers to be formed. Still, in each of these techniques described above, both channeled and channel-less, considerable customized routing (for both standard cell and gate arrays) is done in the M1 and M2 layers. Additional customized layers are also often used. Therefore, at least four masking steps (two for each metal layer) are required to form a customized circuit. Yet, as previously mentioned, each custom mask step will take considerable time and money.

Often important to an IC or electronic circuit designer is customization time. Particularly during the design stages, the engineer may want to obtain a model, or prototype, of his or her designs quickly so that the designs can be tested with other circuitry. In such circumstances, the engineer may opt for a gate array because, although not as flexible as standard cells, it will be faster to get a working chip because fewer mask steps are required for circuit customization (i.e., standard cells require formation of active devices, while gate arrays have pre-formed active devices and only require metalization). Nonetheless, gate arrays can still take several weeks' time to obtain because of the multiple custom mask steps that must be performed just for metalization.

Further, it is generally important to the design engineer to obtain the smallest chip possible containing the maximum amount of functionality. Using a channeled scheme, space used for channels obviously takes away real estate that could otherwise be used for more function blocks or, if removed, would reduce IC size. Of course, using the channel-less scheme described above, otherwise usable function blocks are often unusable. While some companies have gone so far as to develop techniques that require only one mask step for customization, thus reducing turn-around time, almost all of these companies have continued to use channel regions, increasing IC size and/or reducing IC functionality and routing flexibility.

Clearly then, any customizable circuit that can decrease turn-around time while simultaneously maintaining a high degree of functionality and routing flexibility is desirable.

SUMMARY OF THE INVENTION

To create a customizable ASIC with a fast customization turn-around time and high degree of available logic functionality, a routing architecture in accordance with the present invention is disclosed. The routing architecture is generally designed for use with the uppermost two metal layers in an ASIC composed of an array of function blocks. At least some of the metal layers below the uppermost two metal layers are used for local interconnections within function blocks.

The second-to-uppermost metal layer of an architecture in accordance with the invention has a predefined and fixed layout, including a plurality of parallel segmented conductors extending in a first direction in one embodiment of the invention. This second-to-uppermost, or "fixed", metal layer also includes pin connections to the inputs and outputs of the function blocks.

When an insulating layer is formed over the fixed metal layer, vias are formed through the insulating layer to the fixed metal layer below. In some embodiments of the invention these vias are formed to couple to the endpoints of each segment of the segmented conductors as well as to couple to various points between the endpoints of some of the segments. Other embodiments of the invention allow some or all of the vias to be placed in a customized manner.

On top of the insulating layer is formed the uppermost metal layer, or "customizable" metal layer. Metal in the customizable metal layer is selectively placed within a plurality of parallel predesignated tracks that are over the area space of the parallel segmented tracks of the fixed metal layer and that run in a second direction substantially perpendicular to the first direction.

The routing architecture of the present invention permits flexible routing of horizontal and vertical connections among function blocks and does so in the area space directly above the function blocks without using channels for customized routing and without rendering function blocks unusable. At the same time, an ASIC built in accordance with one embodiment of the invention can be customized with a single mask step, creating a customized ASIC in a short time period and at a reduced cost. Moreover, the routing architecture still permits high performance designs to be implemented.

BRIEF DESCRIPTION OF THE DRAWINGS

The invention will be described with respect to particular embodiments thereof, and reference will be made to the drawings, which are not necessarily drawn to scale, and in which:

FIGS. 6–9 are each generalized block diagrams of an architecture in accordance with the invention showing various features and/or enhancements utilized by some embodiments of the invention;

FIG. 6a is a legend for use with FIGS. 6–9;

FIGS. 12a–12c show a portion of FIG. 11 and an example of routing using the architecture shown in FIG. 11;

DETAILED DESCRIPTION

Figure 1:
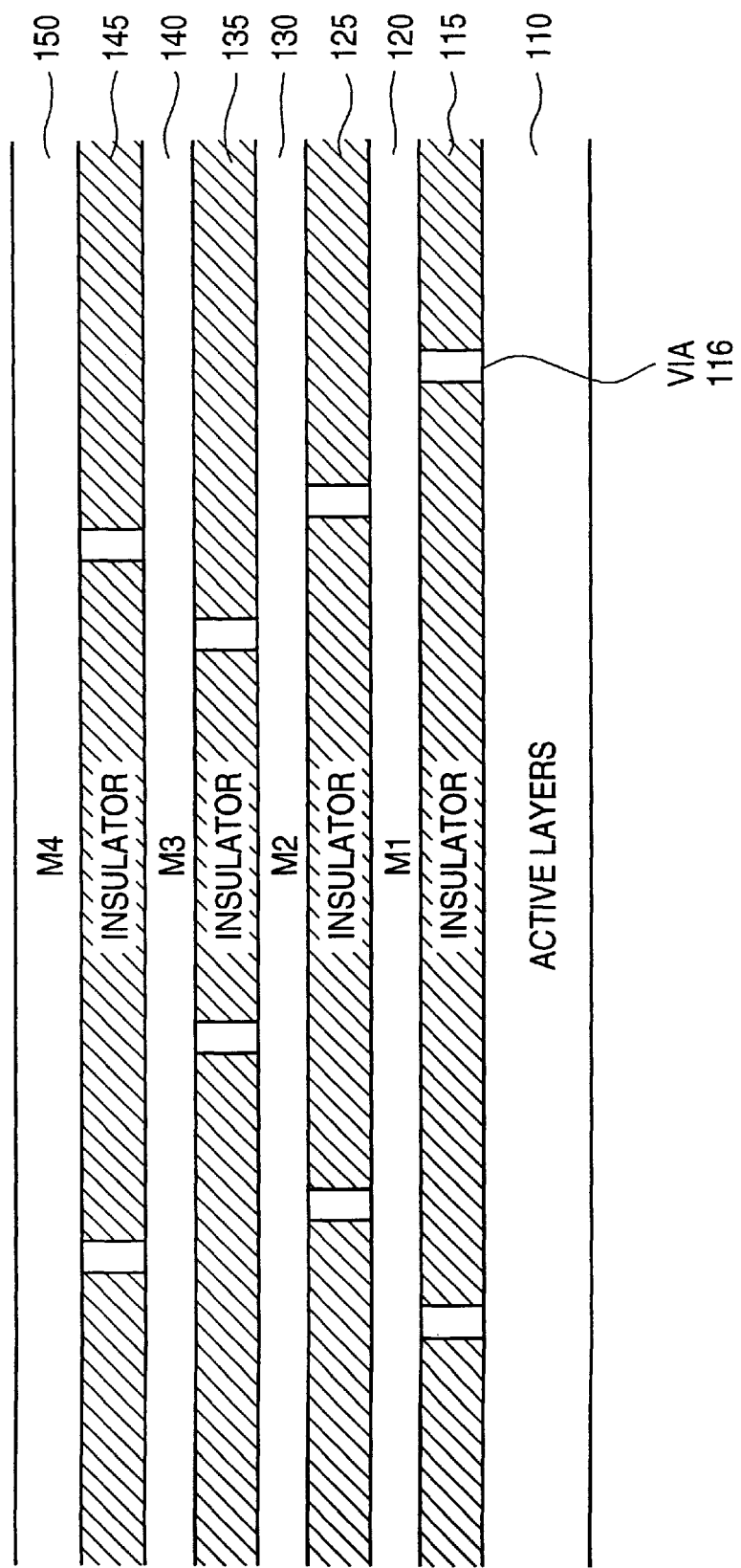
FIG. 1 is a cross-sectional view of a generic integrated circuit.
Figure 2:
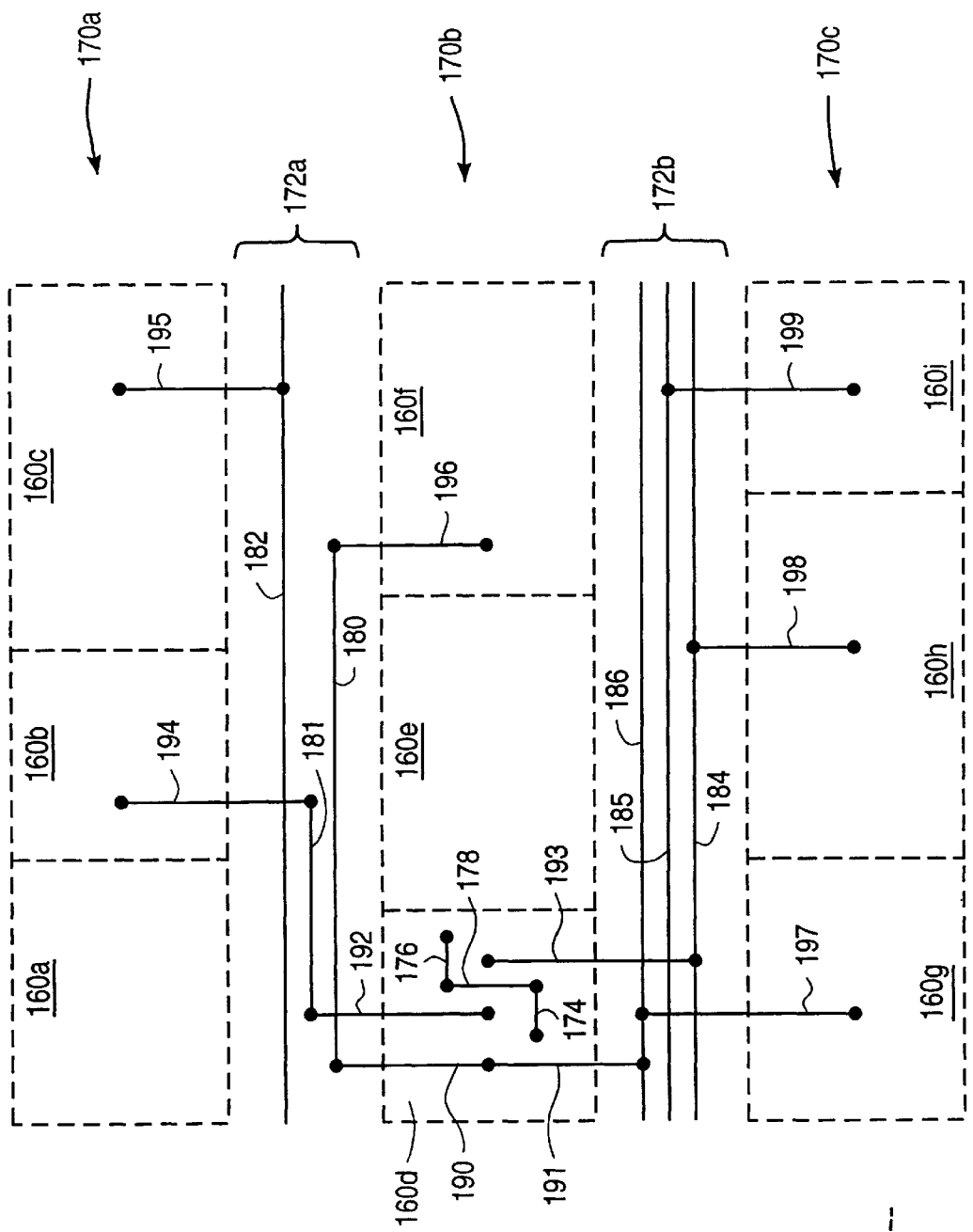
FIG. 2 is a generalized block diagram of a standard cell ASIC using channeled routing.
Figure 3:
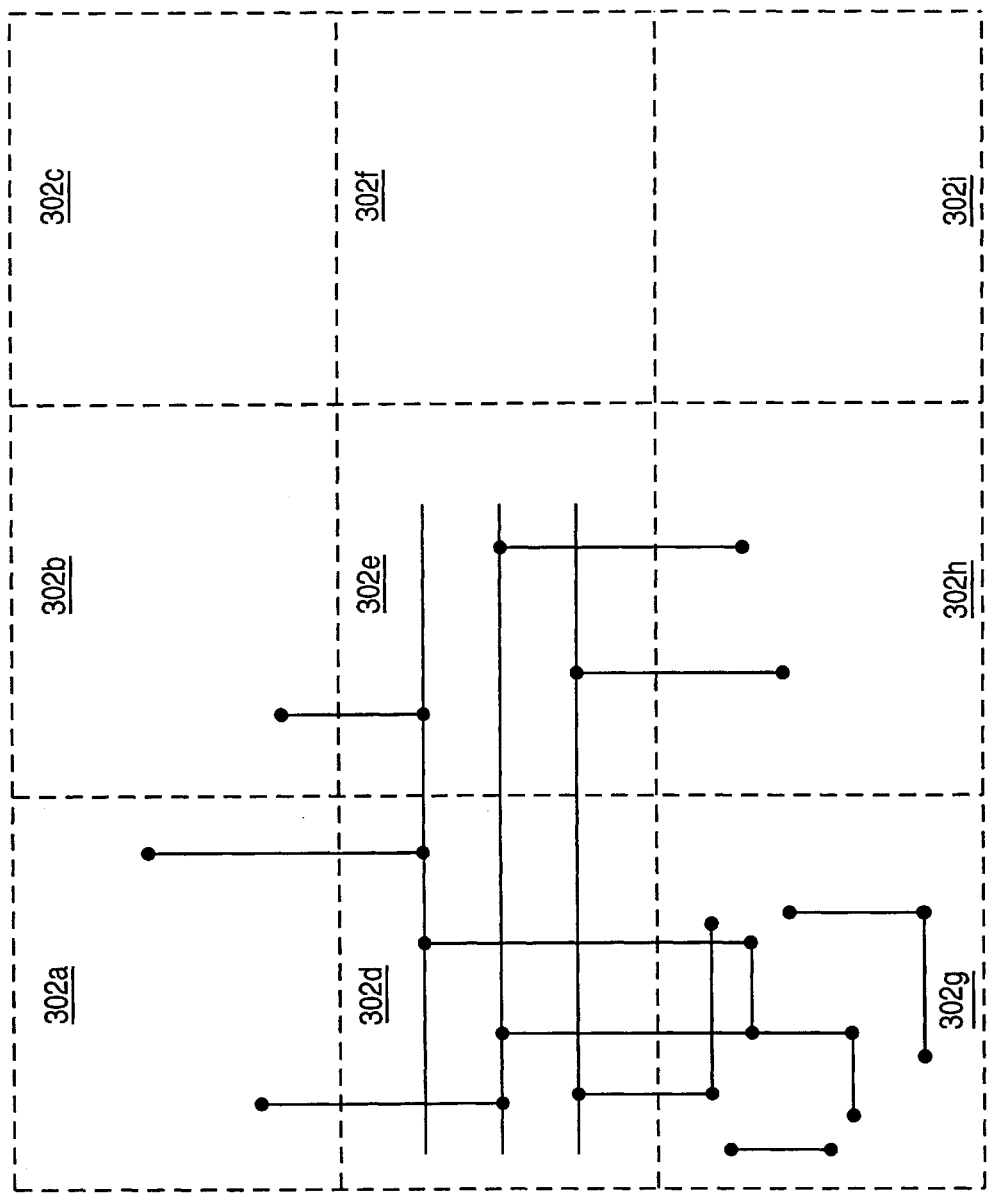
FIG. 3 is a generalized block diagram of a gate array using a channel-less routing approach.
Figure 4:
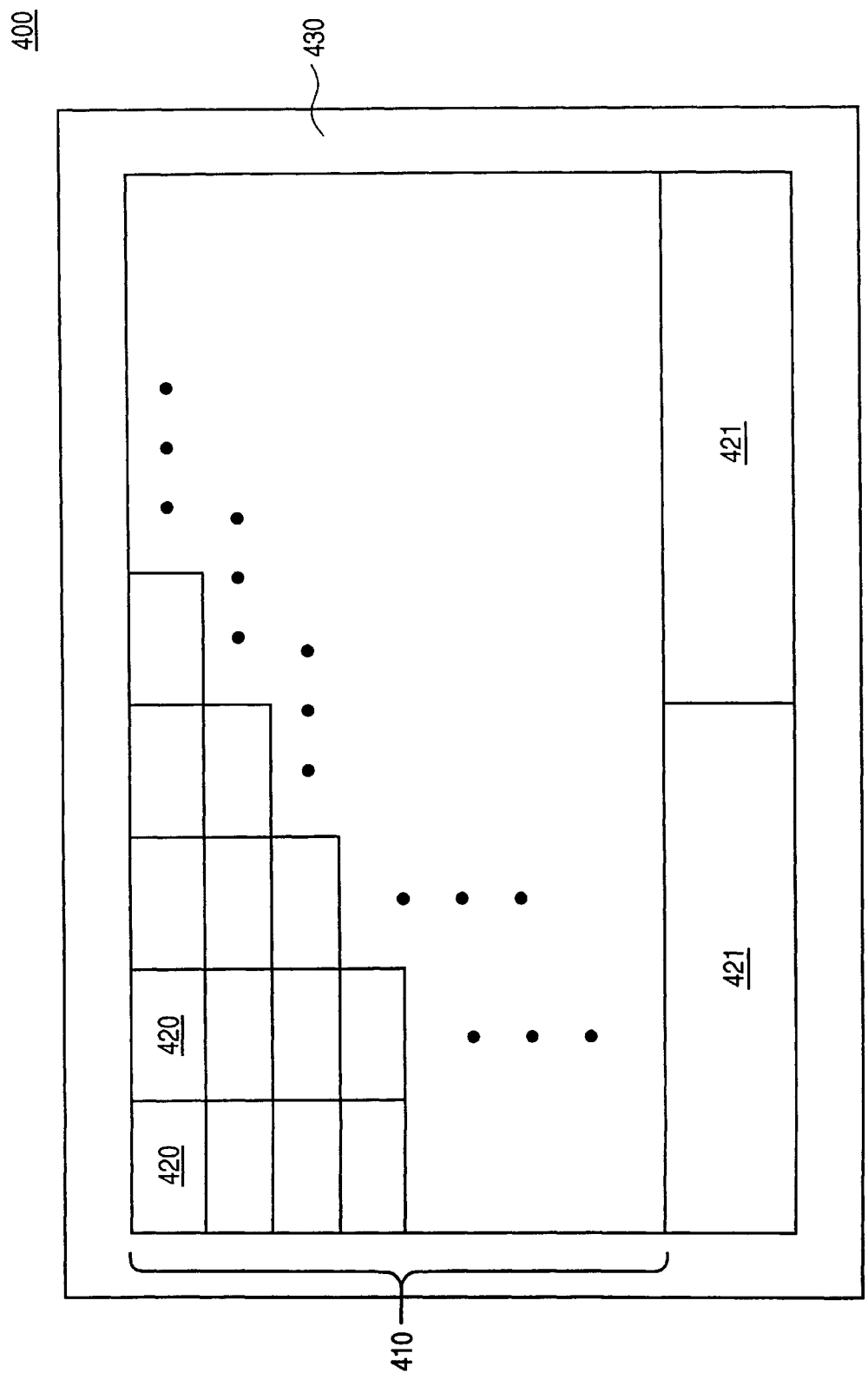
FIG. 4 is a generalized block diagram of an ASIC in accordance with the invention.

A generalized block diagram of an ASIC 400 in accordance with the invention is shown in FIG. 4. ASIC 400 includes an array 410 of function blocks 420. In one embodiment of the invention, each function block 420 is identical to the other function blocks in array 410, although other embodiments of the invention allow for variance among function blocks. Some embodiments may include one or more other regions 421, which contain other circuitry such as memory blocks or logic cores. Also shown in FIG. 4 is periphery area 430 surrounding array 410. Periphery area 430 includes circuitry such as 10 pads and other support circuitry for array 410.

Figure 5:
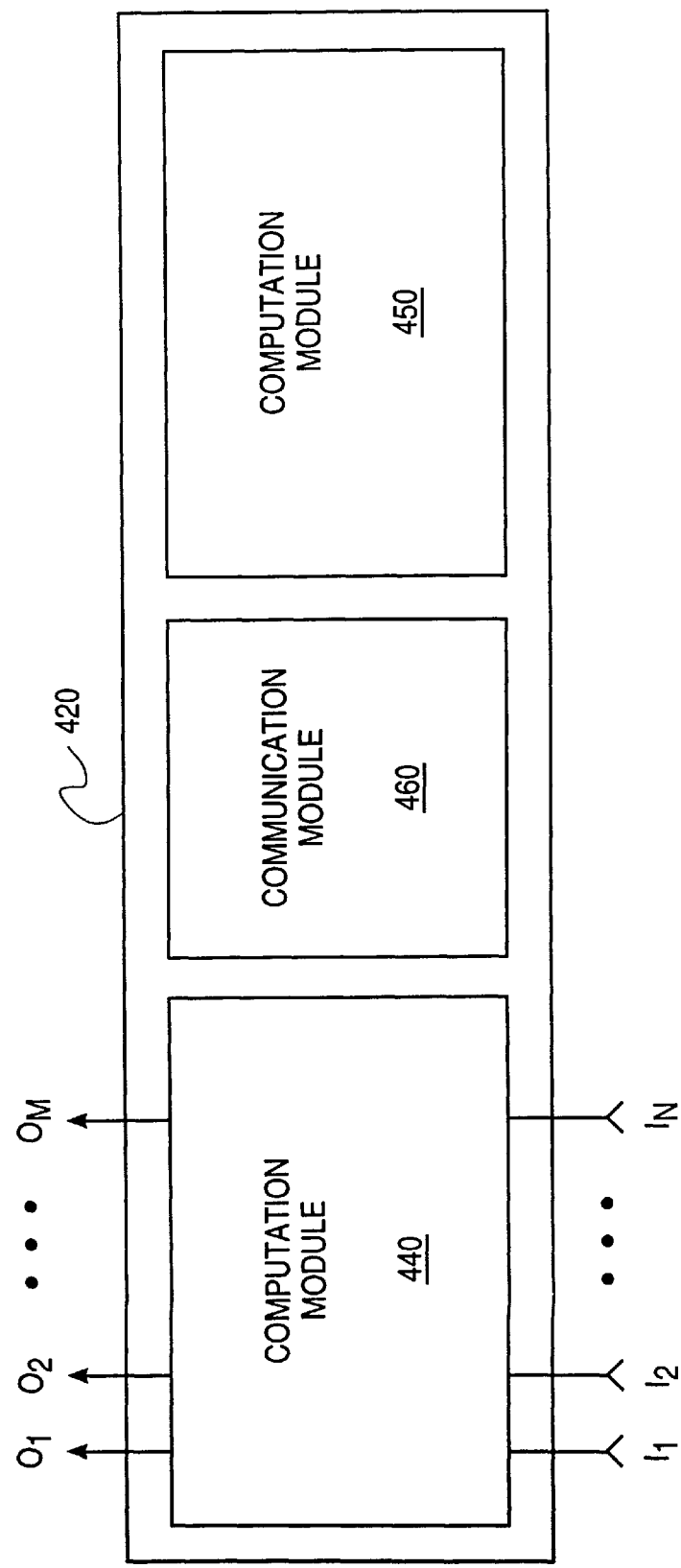
FIG. 5 is a generalized block diagram of a function block in accordance with one embodiment of the invention.

Each function block 420 can be configured to perform combinational functions, sequential functions and/or memory functions (e.g., SRAM). As shown in FIG. 5, one embodiment of function block 420 is generally composed of three modules: two computation modules 440 and 450 and a communication module 460, each having a fixed internal architecture, including arrangement and connection of active devices, but whose functions can be varied by varying input signals to each module. For instance, an input may be varied by tying the input to a logical high signal, a logical low signal, the output of the same or different module or a signal from off-chip. As shown in FIG. 5 each module, and the entire function block 420 for that matter, has any number of inputs, $I_1 \ldots I_n$, and any number of outputs, $O_1 \ldots O_m$. Computation modules 440 and 450 are identical mirror images of each other in one embodiment of the invention. A detailed description of one embodiment of the internal structure of each function block 420, including computation and communication modules 440, 450, and 460, can be found in application Ser. No. 08/821,475, filed on Mar. 21, 1997, and entitled "Function Block Architecture for Gate Array," incorporated by reference herein.

As shown in FIG. 4, each function block 420 is substantially contiguous to each adjacent function block. In other words, no channels are formed between the function blocks 420 in one embodiment of the invention. Each function block 420 has a fixed internal transistor structure with fixed connections between the transistors and/or other active devices within each function block 420. Thus, all of the routing internal to each function block 420 will be fixed (non-customizable) and lower metal layers, e.g., M1 and M2, can be pre-formed in a fixed and predetermined manner, using horizontal connectors in M1 and vertical connectors in M2 (or vice versa). Of course, more than two metal layers can be used to form the local interconnections within each function block 420 in other embodiments of the invention.

As described, an array in accordance with the invention will be customized by varying the inputs to each function block. Thus, the customization of the array entails forming the connections between the function blocks and connections to power and ground lines. In other words, customization is done by routing. In order to allow fast customization time, the architecture in accordance with the invention allows routing between function blocks to be customized using the uppermost two metal layers for a given integrated circuit. For ease of discussion, these uppermost two metal layers will be referred to as M3 and M4. It is to be understood, however, that since there could be more than four layers, the uppermost two metal layers for a given integrated circuit may not actually be M3 and M4, but may be, for example, M5 and M6, M7 and M8, etc. Use of the terms M3 and M4 is not intended to limit the invention.

Referring now to FIG. 6, a preliminary routing structure is shown for implementing an architecture in accordance with the invention. It is to be understood with reference to FIG. 6 that local interconnections within each function block are formed in lower metal layers, e.g., M1 and M2, which are not shown. A third metal (M3) layer (the second-to-uppermost metal layer) is composed of a plurality of a parallel segmented conducting lines 510, each composed of multiple segments 512. Each segment 512 has a via 530 formed at its respective ends to enable connections to the uppermost (M4) layer above. In the M4 layer, horizontal tracks 550 run perpendicular to the segmented conducting lines 510. Tracks 550 are not fixed metal, but rather represent predesignated areas where metal can be placed in the M4 layer to form an interconnection. Thus, FIG. 6 represents a structure that allows horizontal and vertical connections to enable routing, where the vertically placed metal is fixed and pre-formed and the horizontally placed metal is customizable in a predesignated manner. For example, to connect point A to point B in FIG. 6, M4 metal can be placed in horizontal M4 track 551, extending from M3 segment 512a to M3 segment 512b. M4 metal would also be placed to form a connection from the metal in track 551 to the via at point A and at point X. M4 metal would also be placed to form connections between vias 530a and 530b as well as vias 530c and 530d.

FIG. 6A shows a legend for FIG. 6. FIG. 6A indicates that the metal of M3 for each segment 512 has a given width and is lain to surround the vias 530 at either end of each segment 512, resembling a "dogbone." Hence, the segments 512 of each parallel segmented conducting line 510 are sometimes referred to herein as "dogbones." Horizontal lines 550 represent the tracks where M4 metal can be placed in customizing the circuit. Although dogbones and tracks are shown to be separated, in practice they are positioned as close together as possible without actually touching.

As can be seen using the structure of FIG. 6, once particular tracks are utilized in M4, obstructions to forming other connections will occur. For instance, if tracks 551 and 554 have been utilized in forming other connections, tracks lying between these two tracks, 552, 553 may not be able to access a via. Therefore, in FIG. 7, additional vias 560 are added for each dogbone (segment) 512. Vias 560 are added such that each via 560 has unobstructed access to two M4 tracks: one track from above and one track from below. Note that although vias 530 and 560 are shown as different sizes in FIG. 7, no distinction in actual size need be made in various embodiments of the invention, and such size distinction is used merely for clarity of the illustration.

Of course, access must be had to the various inputs and outputs for each function block 420. Thus, in FIG. 8 shorter dogbones (segments) 572 are added in the M3 layer between longer dogbones 512 of parallel segmented connectors 510. Pin connections 570 to the inputs and outputs of the function blocks are placed in M3 between the ends of the short dogbones 572 and are formed in a manner similar to that used for forming vias. Therefore each pin 570 can be selectively connected to the M4 layer through the vias at the end of each short dogbone 572. In other words, the pins themselves do not reach M4 except through the vias at the ends of short dogbones 572 in one embodiment of the invention. Further, the pins 570 are easily connected to longer dogbones 512 for vertical routing by coupling the vias of the vertical segmented connectors 510. For instance, to connect pin 570a to point E, vias 530e and 530f are coupled in M4.

Figure 8:
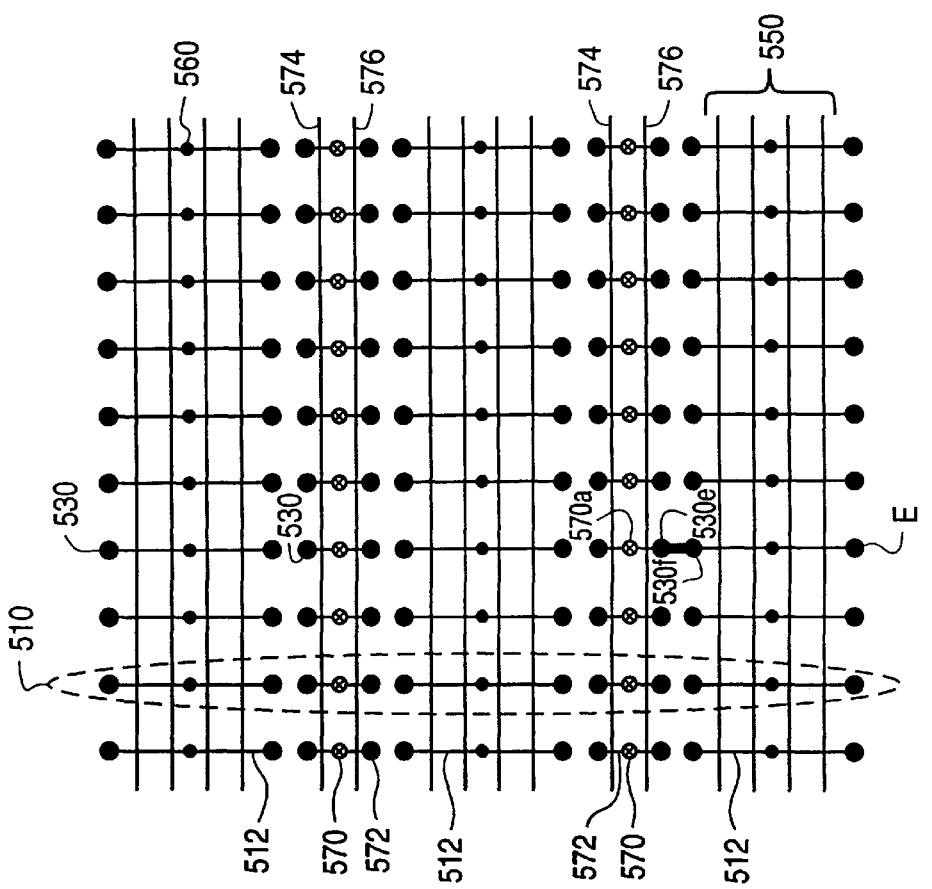

Also in FIG. 8, because power and ground are frequently used as input and output values for function blocks 420, dedicated power and ground lines are formed in M4 at 574 and 576, where line 574 represents a dedicated power line and 576 represents a dedicated ground line. While other embodiments of the invention do not utilize the short segments 572, simply bringing pin connections to M3 amid longer dogbones 512, utilizing the short segments 572 allows additional flexibility. Without the short segments, the easy ability to connect to power and ground would disappear as routing to power and ground would be through the longer dogbones 512, decreasing active routing density and reducing flexibility.

Figure 10:
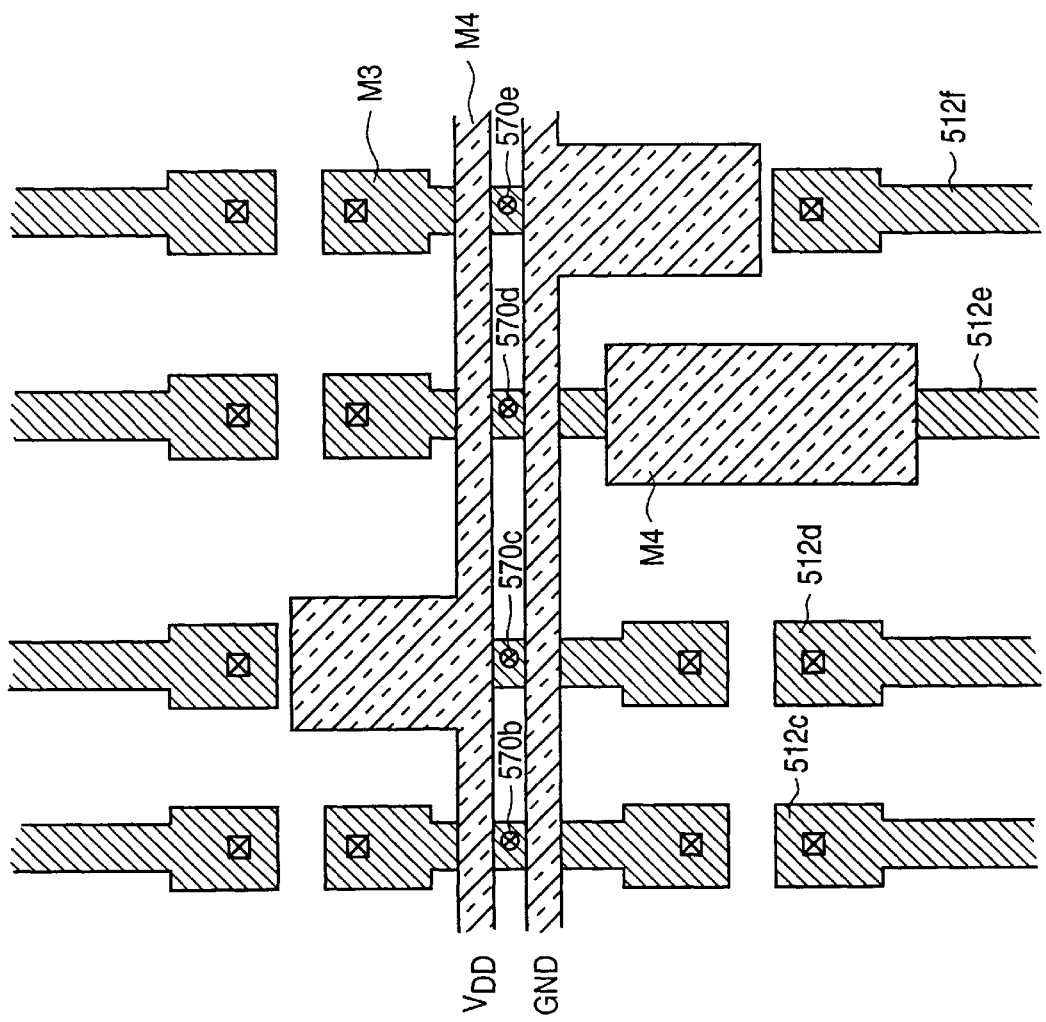
FIG. 10 shows a block diagram of an example of routing placement in accordance with one embodiment of the invention.

FIG. 10 shows a more detailed view of an example demonstrating how various pins are connected to signals. FIG. 10 shows pin 570c coupled to power while pin 570e is coupled to ground. Pin 570d is coupled to long dogbone 512e. In one embodiment of the invention the unused vias, such as 512c, additionally are covered with a small piece of M4 metal (not shown) that is not connected to anything else to prevent etch-back of the vias.

Figure 9:
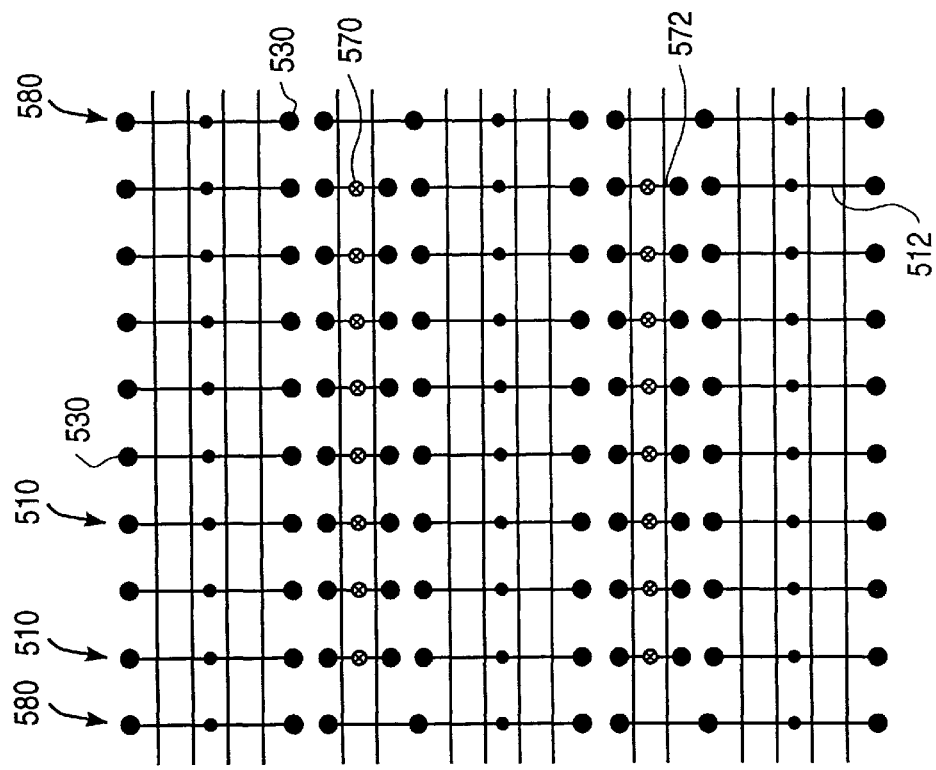

Often, signals will have to be routed for long distances. Thus, some embodiments of the invention periodically insert "freeways," segmented connectors in M3 parallel to segmented connectors 510 but unconnected to any pins and having fewer segment-forming breaks. Such freeways are shown in FIG. 9 at 580.

Figure 11:
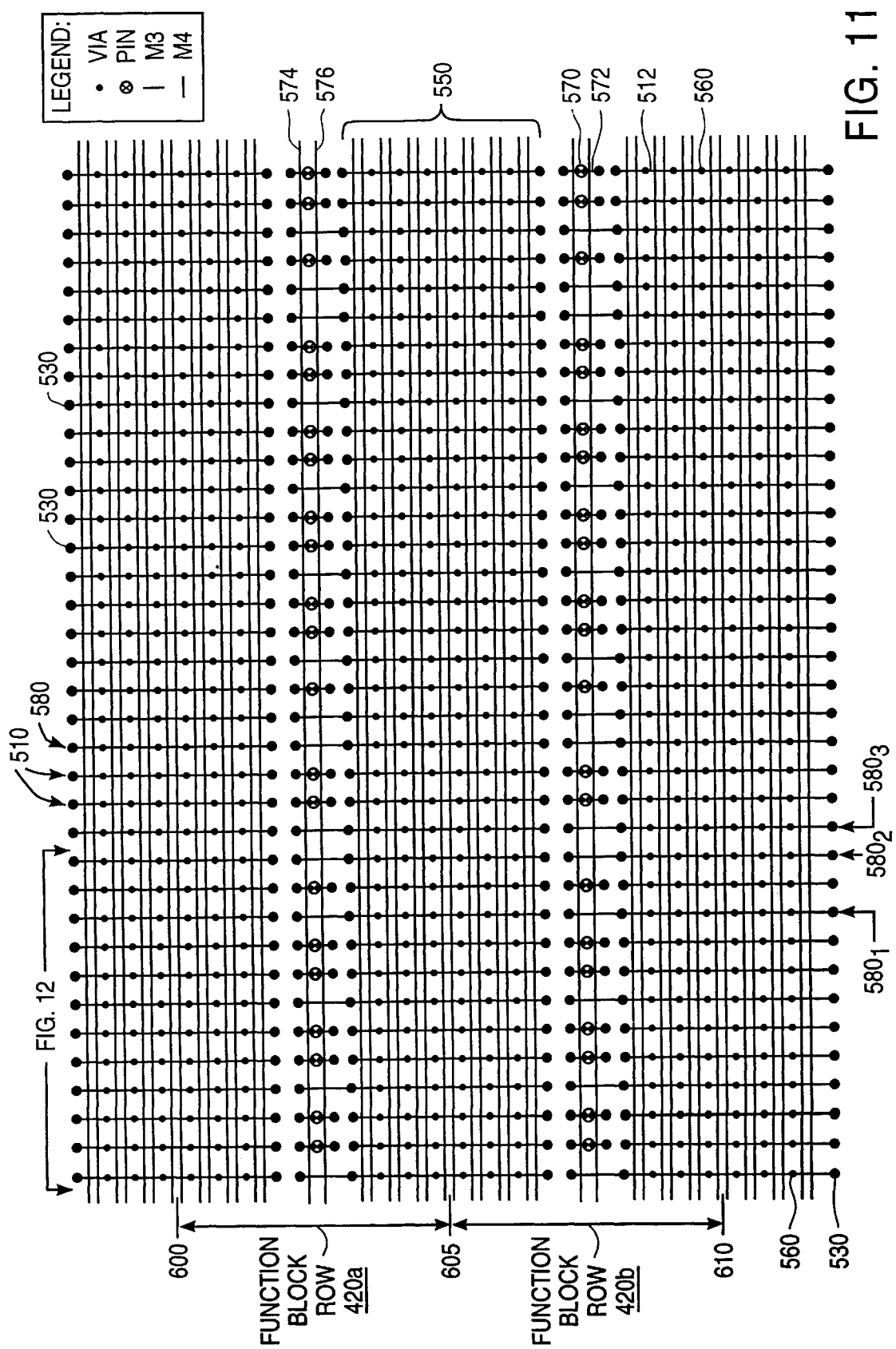
FIG. 11 is a generalized block diagram of a routing architecture in accordance with the invention.

FIG. 11 shows one embodiment of the routing structure as described with respect to FIGS. 6–9. All of the vertical connectors shown (parallel segmented connectors 510 and freeways 580) are fixedly formed in M3. Horizontal lines 550 represent tracks in which M4 metal can be selectively placed for customized routing. All of the routing is formed over the area space where active devices for each function block are formed. Thus, as shown, the routing structures in M3 and M4 between lines 600 and 605 are over the area space of a first row of function blocks 420a while the routing structures shown between lines 605 and 610 is over the area space of a second row of function blocks 420b. The routing structure formed above line 600 and below line 610 are areas over function blocks adjacent to Function Block Row 420a and Function Block Row 420b, respectively. Pins 570 represent the inputs and outputs to the function blocks in rows 420a and 420b. As should be clear from the above discussion, the vertical connectors 510 in M3 are segmented to allow selective joining of the segments, permitting a flexible routing structure.

As shown, long dogbones 512 in the M3 layer include in one embodiment, multiple vias between the long dogbone ends. Each via has access to two M4 tracks—one track above the via and one track below the via.

Also shown in FIG. 11 are freeways 580. Freeways 580 may be placed singly, with segmented connectors 510 on either side, as shown at $580_1$. In other instances, more than one freeway may be placed next to one another as shown at $580_2$ and $580_3$. Often, it will be useful to place a freeway next to a segmented conductor 510 having an output pin in a short dogbone 572 since outputs are often routed for longer distances.

Thus, as can be seen in FIG. 11, a flexible routing architecture is provided, allowing each pin to receive signals from above the function block 420 or from below the function block 420, as well as double entry signals. Further feed-through signals (using freeways 580) can easily be implemented. (Routing for specialized regions 421 can be done in accordance with the invention or by their own routing structure.)

FIG. 12c shows an enlarged portion of function block row 420a shown in FIG. 11. FIG. 12c will be used to describe an example using a routing architecture in accordance with the invention. Referring to FIGS. 12a–c, the active layers may define several transistors, which when connected by M1 and M2 layers (and/or by one or more layers below the uppermost two metal layers) form multiplexor 700 shown in FIG. 12b. Multiplexor 700 will have several inputs, D0–D3, S0, and S1. Multiplexor 700 will also have an output P. As is known in the art, the multiplexor 700 can be configured to form the 3-input AND gate of FIG. 12a by connecting inputs D1–D3 to ground, and using inputs D0, S0, and S1 as inputs A, B, and C, respectively.

Referring to FIG. 12c, showing M3 and M4 in accordance with the invention, each input and output of multiplexor 700 is coupled to a pin 570. To customize the multiplexor 700 to form the AND gate of FIG. 12a, the following connections would be made. Pin D0 would be connected to ground, line 576, as would pin D1 and pin D2. Pin D3 is coupled by via 702 to via 704 and along track 706 to form signal A, which may come from off-chip or from a different function block. Similarly, pin S0 is coupled through via 708 to via 710 to couple it to segment 712. In order to reach track 714, via 716 is coupled to track 714 to form input B, which may also be a signal from off-chip or from another function block. In a similar manner pin S1 is coupled to form input C. Output P is coupled through its via 718 to line segment 720. Using track 722 output pin P is coupled to freeway 724 through via 726. Alternatively, via 728 could be coupled in M4 directly to via 730 of freeway 724, thereby avoiding use of any segments 512 to allow them to be used for other routing. Such a technique of joining adjacent vias in M4 could be done anywhere convenient to do so, i.e., connecting the vias of shorter adjacent dogbones 572 to connect two adjacent pins 570.

An architecture in accordance with the invention has thus been described that allows for flexible interconnections over the space provided for active (used) function block areas. The routing architecture is provided with the second-to-uppermost metal layer being fixed. An insulating layer with vias formed therein is formed over the second-to-uppermost metal layer. Although described above as being fixed, some embodiments of the invention allow the via placement to be customizable. The uppermost metal layer, formed over the insulating layer, is customizable in a predetermined manner (i.e., M4 metal is to be placed in pre-designated places). Thus, an architecture in accordance with the invention can be customized with only one mask step (for the uppermost metal layer) when the vias between the uppermost metal layers have a fixed placement. Such a one-mask customizable architecture will allow for fast customization turn-around time (especially when everything but the final metal layer is pre-manufactured and stored), while at the same time allowing for maximized functionality of a particular integrated circuit since the inter-function-block routing can occur directly over the function block active areas.

Architecture Flexibility and Alternative Embodiments

Figure 13:
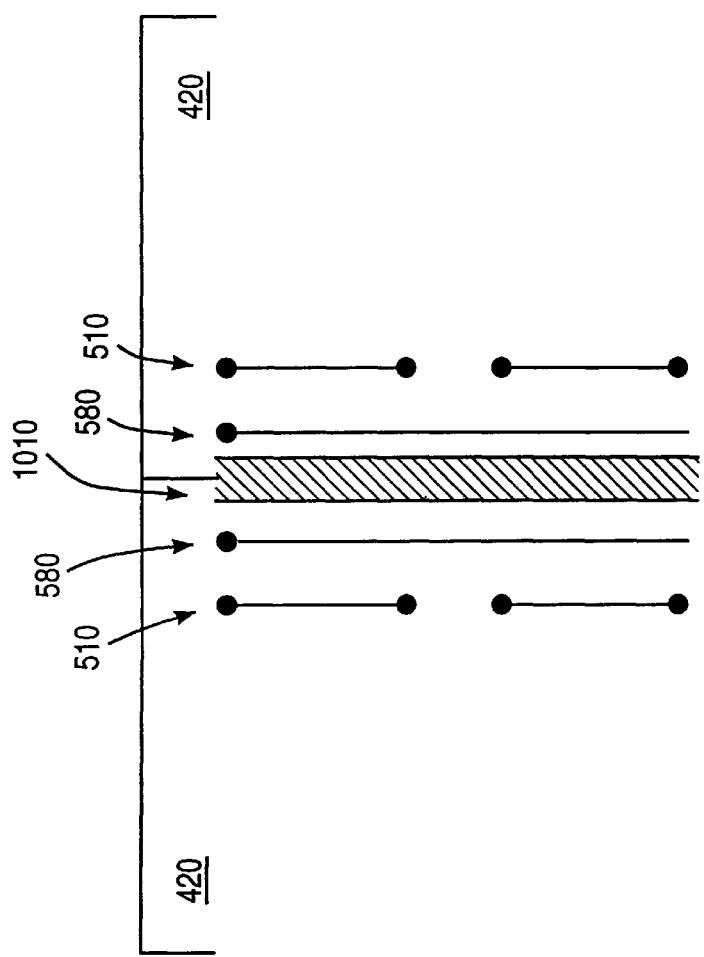
FIG. 13 is a generalized block diagram of a portion of an architecture in accordance with one embodiment of the invention and showing use of a power bar.

The routing architecture of the present invention allows for considerable flexibility in addition to that described above. For instance, FIG. 13 shows an additional benefit to the routing architecture of the present invention. In some embodiments of the invention a power bar 1010 is placed in M3 between the vertical boundary of each function block 420. The power bar 1010 is tied to a constant voltage and is used for power distribution among the function blocks 420. As is generally known in the art, when a pair of signals is routed for long distances next to each other, the lines can couple capacitively and be subject to considerable noise. Therefore, in one embodiment of the invention a freeway 580 is placed adjacent to the power bar 1010 in each function block. Next to freeway 580 is placed a segmented conductor 510. In this manner, the freeway 580 adjacent to the power bar has a high probability of avoiding adjacent long signals.

Figure 14:
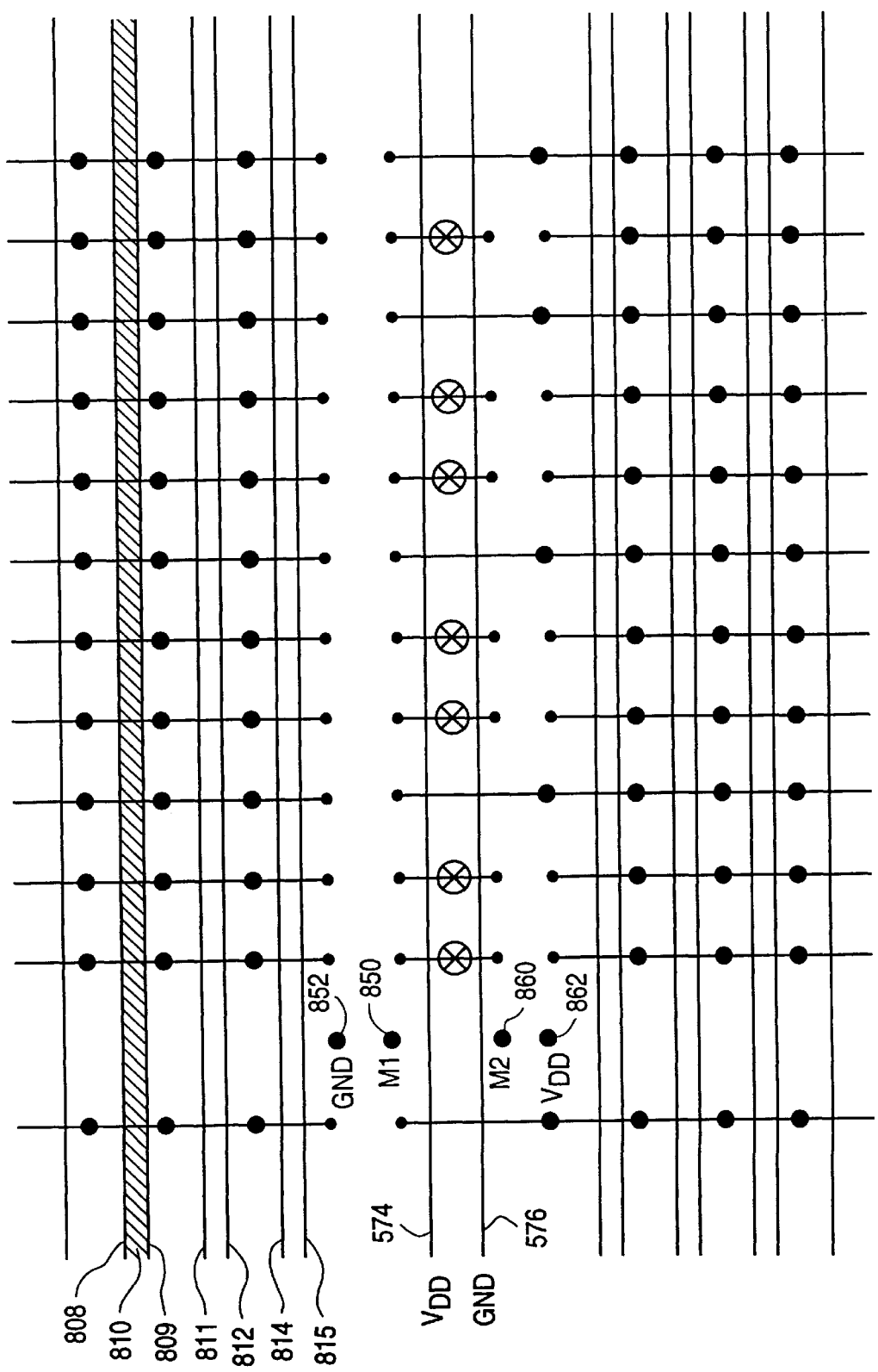
FIG. 14 is a generalized block diagram of a portion of an architecture in accordance with one embodiment of the invention and showing use of a double-width wire as well as mode pins.

Moreover, M4 metal lines of variable width can be formed, e.g., a double-width wire can easily be formed in M4 by utilizing adjacent horizontal tracks 808 and 809 and filling in M4 metal in the tracks and in between the tracks, as shown in FIG. 14 at 810. Such double-width wires are particularly useful for distributing clocks or providing power and ground lines. In addition, clock trunks (or "spines") can easily be implemented by forming several double-width wires and interconnecting them. For instance, a double-width wire can be formed with tracks 808 and 809 (double width wire 810) as well as tracks 811 and 812, and tracks 814 and 815, and then connecting each of the double-width wires so formed to one another, for example, in the space over power bar 1010 shown in FIG. 13 (since the power bar will have few obstructing vias). Further, when horizontal tracks are used to form a clock trunk, M3 segments beneath the clock trunk can be coupled to ground to form a partially isolating ground plane.

In addition, the segmented connectors in M3 can also be formed of variable width, i.e., the invention should not be construed as limited to a fixed metal layer of segmented connectors of equal width. For instance, because freeways 580 often carry signals for relatively long distances, it may be desirable in some embodiments of the invention to form freeways 580 wider than segmented connectors 510.

One alternative embodiment of the invention may utilize stacked mode pins, i.e., pins that are always known to be a constant value. Such mode pins are shown in FIG. 14 at 850 and 860. By providing an additional connection to ground at 852, mode pin 850 could easily be connected to power line 574 or ground at 852, using M4. Likewise by providing an additional connection to power at 862, mode pin 860 could easily be coupled in M4 to ground line 576 or to power at 862. Because mode pins are not coupled to an active, changing signal, mode pins can be "stacked" in the vertical direction, preserving routing space.

Figure 15:
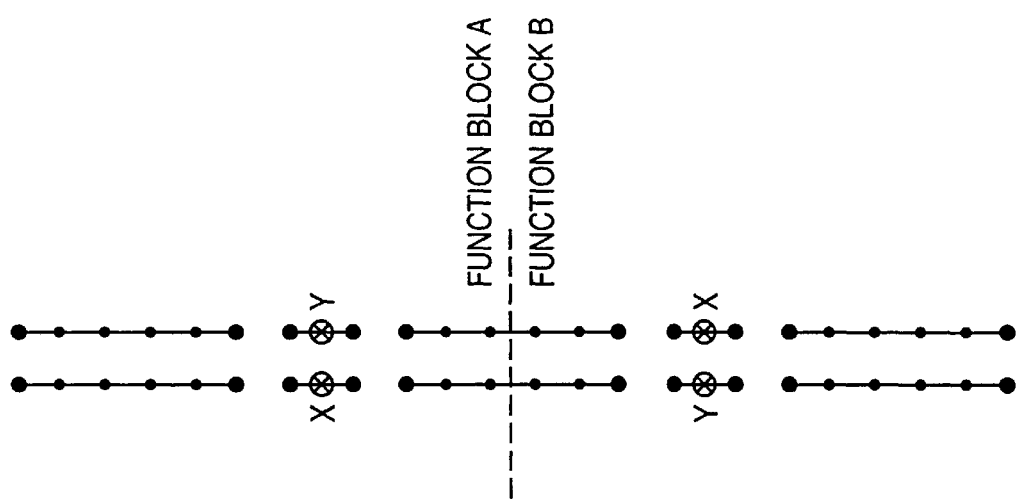
FIG. 15 is a generalized block diagram of a portion of an architecture in accordance with one embodiment of the invention and showing pin "twisting.

Still other methods can easily be utilized with the architecture of FIG. 11 to improve system performance. For instance, if one function block pin is known to have a high usage rate while other pins are known to have much lower usage, then in every other row of function blocks the pins can be "twisted", or alternated. For instance, in FIG. 15, suppose a function block 420 contains pin X and pin Y. If pin X is a high usage pin and pin Y is low usage, it is beneficial to place these pins together next to each other as shown in function block A. Then in the function block immediately adjacent above or below function block A, e.g., function block B, the pins can be reversed as shown in FIG. 15. In this manner, the high usage pins have a higher chance of being unobstructed both above and below and more flexibility in routing is obtained (e.g., double entry is available on more pins in the function blocks).

Other ways to increase routing density are to place pins that are often connected together next to each other. In this manner, the vias connected to the pins can be directly connected together with a short M4 metal connection that avoids usage of other routing resources.

As mentioned above, some embodiments of the invention use configurable vias between M3 and M4 rather than the fixed vias described with respect to the embodiment of FIG. 11. Such customizable vias would allow each row of inner vias (those between the ends of the dogbones) to be replaced by an additional track; customizable vias could then be placed to couple M3 metal to any M4 track. While having configurable vias will increase the number of mask steps for customization to two mask steps, the turn-around time will still be fairly rapid while at the same time maintaining circuit functionality and increasing routing flexibility.

Figure 17:
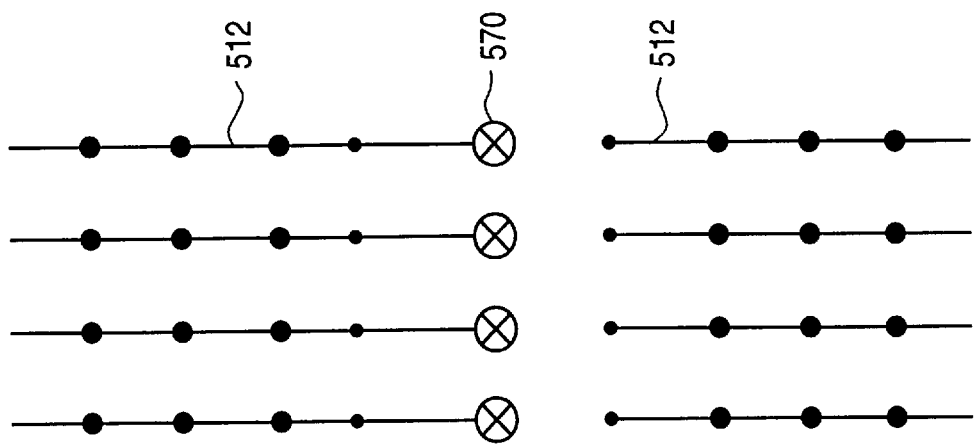
" and FIGS. 16–18 are each generalized block diagrams of portions of an architecture in accordance with alternative embodiments of the invention.
Figure 16:
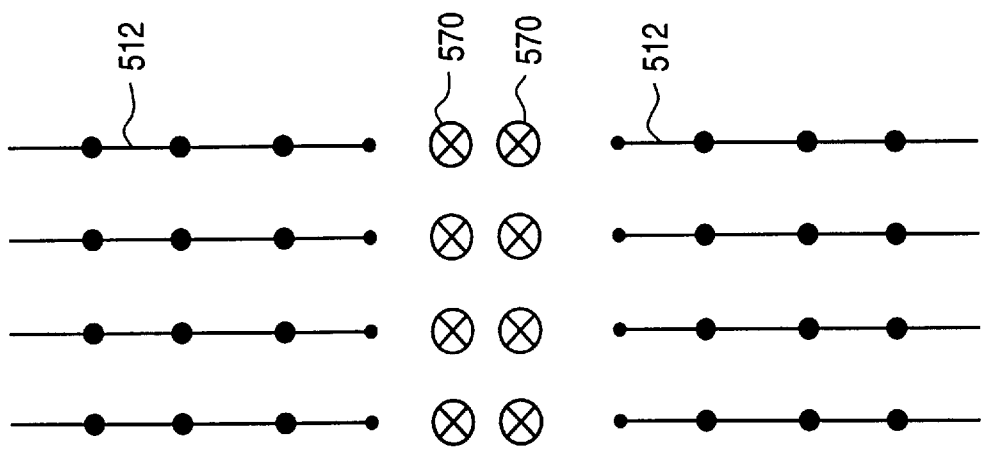

Of course, still other embodiments of the invention could be implemented as will be understood by those of skill in the art. For instance, rather than using short dogbones 572 coupled to a pin 570, two vertically stacked pins could be used instead, without a short segment, as demonstrated in FIG. 16. The upper pin could be selectively coupled to the long dogbone 512 above while the lower pin would be able to be selectively coupled to the long dogbone 512 below. Alternatively, rather than using short dogbones 572, each pin 570 could be permanently coupled to the long dogbone 512 above (or below) the pin 570, as illustrated in FIG. 17. Such a permanent coupling would force routing entry to the pin in a single direction, e.g., routing to the pin would always occur as a result of entry above the pin.

Figure 18:
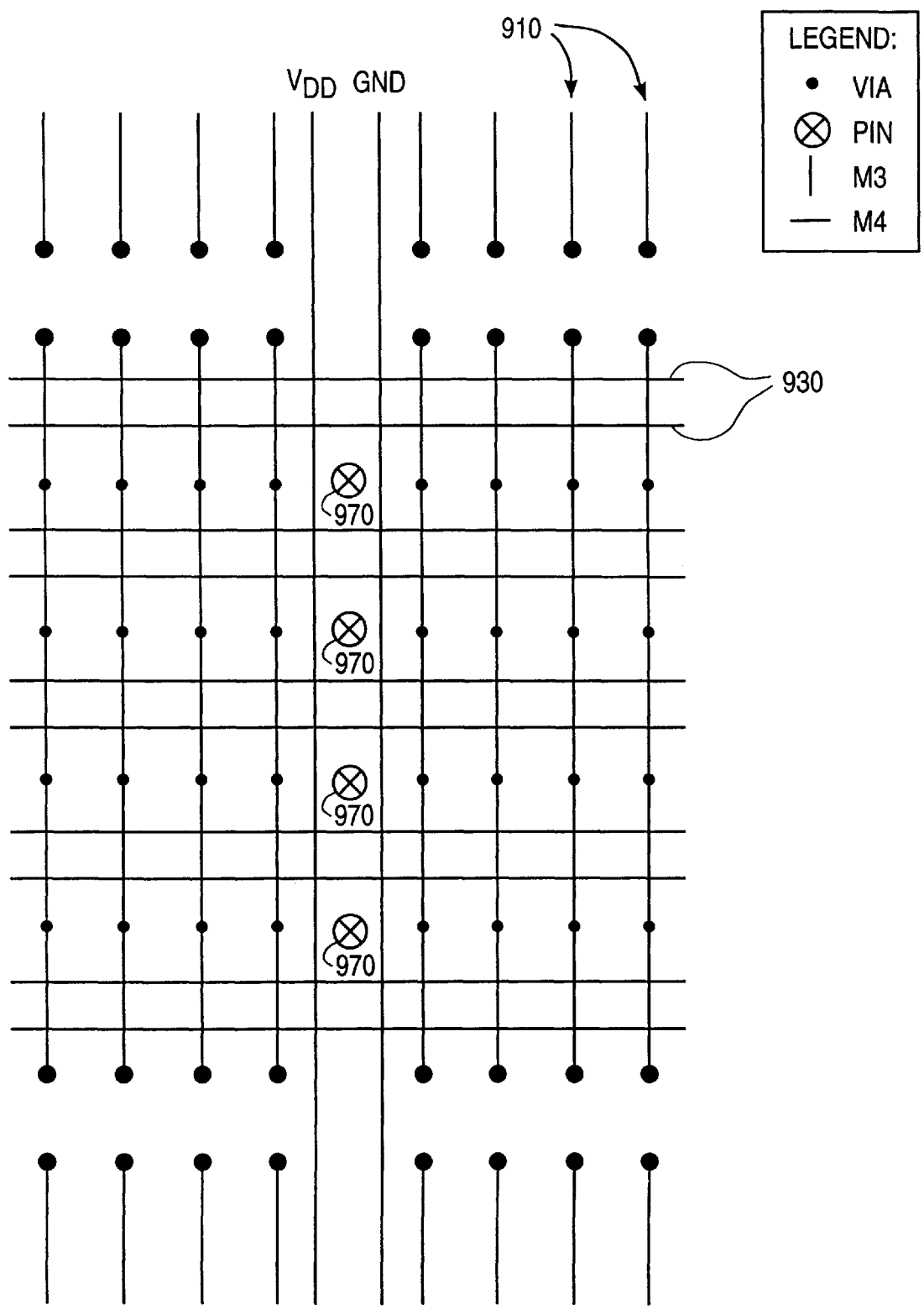

FIG. 18 shows still another alternative embodiment of the invention where vertical segmented conductors 910 are formed in layer M3 along with power and ground lines. Vias are formed between layers M3 and M4 at segment end points as well as at various other points along the segments. Pins 970 are vertically stacked and are also formed up through to layer M4. Horizontal tracks 930 are available for placement of metal in M4. As shown in FIG. 18, there are two horizontal tracks positioned between each pair of vias allowing unobstructed access to tracks and routing flexibility.

Not only is routing between function modules configurable, but various IO and periphery circuitry 430 can also be easily configurable with a method in accordance with the invention. For instance, it is desirable for IO pads to perform any of a plurality of functions. By providing switches that can be configured using M4, IO pads can be easily customized with the same single mask step utilized for configuring function blocks. Similarly, phase-locked loops (PLLs), ROMs, and other periphery circuitry can be configurable in much the same method, i.e., by placing jumpers or switches in the PLL, ROM, or other circuit.

Finally, while the routing architecture of the present invention has been described as essentially "channel-less," in some embodiments there may be separation between the function blocks. For example, in some embodiments of the invention, there could be fixed routing in the regions between function blocks. The word "channel-less" as used herein is thus meant to convey a routing architecture with a majority of customizable routing over function blocks rather than being limited to separate channel regions in between function blocks.

Moreover, while lower metal layers below the uppermost two metal layers have been described as being utilized for local interconnections within function blocks, their function is not necessarily so limited. For instance, some of the lower metal layers (or portions of some of the lower metal layers) could be used, in some embodiments, for power distribution, clock distribution, or even some fixed routing.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A semiconductor chip, comprising:
   an array of function blocks, which function blocks are couplable to form an arbitrary circuit, wherein each function block includes a plurality of semiconductor devices formed with a substrate, said semiconductor devices in each function block coupled to form a respective function block circuit within each respective function block, at least some of said function blocks are to be used function blocks in said arbitrary circuit;
   a function block interconnect structure formed independent of any channels dividing said function blocks including:
      a fixed conducting layer formed substantially over a space occupied by said used function blocks, including a plurality of conductors, said fixed conducting layer independent of said arbitrary circuit;
      a customized conducting layer formed over said space occupied by said used function blocks wherein said fixed conducting layer and said customized conducting layer are separated by at least an insulating layer, wherein at least some of said conductors in said fixed conducting layer are in electrical communication with said customized conducting layer;
      wherein said plurality of conductors in said fixed conducting layer includes a first plurality of parallel segmented conductors extending in a first direction; and
   wherein said customized metal conducting layer is substantially formed within a plurality of parallel tracks and over said first plurality of parallel segmented conductors in a second direction substantially perpendicular to said first direction.

2. The semiconductor chip of claim 1, wherein each segment formed by said first plurality of parallel segmented conductors is coupled to a respective via formed through said insulating layer and couplable to said customized metal layer.

3. The semiconductor chip of claim 2, wherein:
   each function block includes an input and an output; and
   said fixed conducting layer includes a plurality of pin connectors to respective ones of said inputs and outputs.

4. The semiconductor chip of claim 3, wherein some segments in said first plurality of parallel segmented conductors are each coupled to a respective one of said pin connectors.

5. The semiconductor chip of claim 3, wherein said plurality of pin connectors extend through said insulating layer to said customized conducting layer.

6. The semiconductor chip of claim 1, wherein one of said plurality of parallel tracks in said customized conducting layer is predesignated as a power line and a second one of said plurality of parallel tracks in said customized conducting layer is pre-designated as a ground line.

7. The semiconductor chip of claim 1, further including a second plurality of parallel segmented conductors, wherein the parallel segmented conductors of said second plurality of parallel segmented conductors are periodically interspersed with the parallel segmented conductors of said first plurality of parallel segmented conductors, thereby forming freeways.

8. A semiconductor chip, comprising:
   a prefabricated substantially channel-less array of function blocks, which function blocks are couplable to form an arbitrary circuit, wherein each function block includes a plurality of semiconductor devices formed with a substrate;
   at least one prefabricated conducting layer that forms at least one connection among said semiconductor devices within each function block thereby forming a respective function block circuit within each respective function block, where each function block has at least one of an input or an output;
   a first insulating layer formed over said at least one conducting layer;
   a prefabricated fixed conducting layer formed over said first insulating layer and substantially over a space occupied by at least some of said function blocks, said fixed conducting layer including a first plurality of parallel segmented conductors extending in a first direction, and wherein said prefabricated fixed conducting layer further includes a plurality of pin connectors to respective ones of said inputs and outputs, said at least some of said function blocks usable in said arbitrary circuit;
   a second insulating layer formed over said prefabricated fixed conducting layer;
   a customized conducting layer used to form said arbitrary circuit and formed over said second insulating layer, wherein said customized conducting layer is substantially formed within a plurality of parallel tracks and over said first plurality of parallel segmented conductors in a second direction substantially perpendicular to said first direction; and
   wherein at least some segments formed by said first plurality of parallel segmented conductors in said fixed conducting layer are coupled to a respective via formed through said second insulating layer.

9. The semiconductor chip of claim 8, wherein:

each segment formed by said first plurality of parallel segmented conductors in said prefabricated fixed conducting layer is coupled at a first end to a respective first via formed through said second insulating layer and each segment is further coupled at a second end to a second respective via formed through said second insulating layer;

at least one segment is coupled, between said first end and said second end, to an additional via formed through said second insulating layer;

wherein said plurality of parallel tracks are positioned in pairs, wherein each pair of tracks lies in a space between a respective pair of vias formed through second insulating layer.

10. The semiconductor chip of claim 9, wherein:

each of said segmented parallel conductors in said first plurality of segmented parallel conductors include a long segment and a short segment, wherein said short segment is coupled to one of said pin connectors.

11. The semiconductor chip of claim 10, wherein two tracks are positioned over said short segment, said two tracks predesignated as a power line and a ground line.

12. The semiconductor chip of claim 11, further including a second plurality of parallel segmented conductors, wherein the parallel segmented conductors of said second plurality of parallel segmented conductors are periodically interspersed with the parallel segmented conductors of said first plurality of parallel segmented conductors, thereby forming freeways.

13. The semiconductor chip of claim 8, further including a plurality of customized vias formed through said second insulating layer.

14. The semiconductor chip of claim 8, wherein said plurality of pin connectors extend through said second insulating layer to said customized conducting layer.

15. A semiconductor chip, comprising:

a substantially channel-less array of function blocks, which function blocks are couplable to form an arbitrary circuit, wherein each function block includes a plurality of semiconductor devices formed with a substrate, at least some of said function blocks to be used function blocks;

at least one prefabricated conducting layer that forms connections among said semiconductor devices within each function block thereby forming a respective function block circuit within each respective function block, where each function block circuit has at least one of an input or an output;

a first insulating layer formed over said at least one prefabricated conducting layer;

a fixed conducting layer formed over said first insulating layer and formed substantially over a space occupied by said used function blocks, said fixed conducting layer formed independent of any channels dividing said function blocks and independent of said arbitrary circuit, said fixed conducting layer including a first plurality of parallel segmented conductors extending in a first direction, wherein each of said parallel segmented conductors in said first plurality of parallel segmented conductors includes at least a long segment and a short segment, wherein each segment of each conductor has a first end and a second end, and wherein said short segment is coupled to a respective pin connector in a plurality of pin connectors, which are coupled to respective ones of said inputs and outputs;

a second insulating layer formed over said fixed conducting layer;

a customized conducting layer formed over said second insulating layer, wherein said customized metal layer is substantially formed within a plurality of predesignated parallel tracks and over said first plurality of parallel segmented conductors in a second direction substantially perpendicular to said first direction;

wherein each segment formed by said first plurality of parallel segmented conductors in said fixed conducting layer is coupled at said first end to a respective first via formed through said second insulating layer and each segment is further coupled at said second end to a second respective via formed through said second insulating layer;

wherein each of said long segments is coupled between said first end and said second end to an additional via formed through said second insulating layer;

wherein said plurality of predesignated parallel tracks are positioned in pairs, wherein each pair of tracks lies in a space between a respective pair of vias formed through said second insulating layer, and wherein one pair of tracks is positioned over said short segment, said one pair of tracks predesignated as a power line and a ground line.

16. The semiconductor chip of claim 15, further including a second plurality of parallel segmented conductors, wherein the parallel segmented conductors of said second plurality of parallel segmented conductors are periodically interspersed with the parallel segmented conductors of said first plurality of parallel segmented conductors, thereby forming freeways.

17. A customizable semiconductor chip, comprising:

a prefabricated substantially channel-less array of function blocks, which function blocks are couplable to form an arbitrary circuit, and wherein each function block includes a plurality of semiconductor devices formed with a substrate;

at least one prefabricated conducting layer that forms connections among said semiconductor devices within each function block thereby forming a respective function block circuit within each respective function block where each function block has at least one of a defined input or a defined output;

a first insulating layer formed over said at least one prefabricated conducting layer;

a prefabricated fixed conducting layer formed over said first insulating layer and substantially over a space occupied by at least some of said function blocks, said prefabricated fixed conducting layer including a first plurality of parallel segmented conductors extending in a first direction, and wherein said prefabricated fixed conducting layer further includes a plurality of pin connectors to respective ones of said inputs and outputs, said at least some of said function blocks usable in said arbitrary circuit;

said prefabricated fixed conducting layer for use with a customizable conducting layer to be selectively formed in locations over a second insulating layer and said prefabricated fixed conducting layer, said fixed conducting layer and said customizable conducting layer for interconnecting said function blocks.

18. The customizable semiconductor chip of claim 17, wherein said semiconductor chip is customizable with only one mask step.

19. The customizable semiconductor chip of claim 17, wherein:
  each of said segmented parallel conductors in said first plurality of segmented parallel conductors include at least a long segment and a short segment,
  wherein said short segment is coupled to one of said pin connectors.

20. The customizable semiconductor chip of claim 17, further including a second plurality of parallel segmented conductors, wherein the parallel segmented conductors of said second plurality of parallel segmented conductors are periodically interspersed with the parallel segmented conductors of said first plurality of parallel segmented conductors, thereby forming freeways.

21. The customizable semiconductor chip of claim 17, further including said second insulating layer wherein each segment formed by said plurality of parallel segmented conductors in said prefabricated fixed conducting layer is coupled to a respective first via formed through said second insulating layer, said second insulating layer being prefabricated.

22. The customizable semiconductor chip of claim 21, wherein each segment formed by said first plurality of parallel segmented conductors in said prefabricated fixed conducting layer is coupled at a first end to said respective first via formed through said second insulating layer and each segment is further coupled at a second end of said segment to a second respective via formed through said second insulating layer;
  at least some segments formed by said first plurality of parallel segmented conductors are each coupled, between said first end and said second end, to at least one additional respective via formed through said second insulating layer.

23. The customizable semiconductor chip of claim 21, wherein at least a portion of said customizable conducting layer is to be formed in a plurality of parallel tracks and over said first plurality of parallel conductors in a second direction substantially perpendicular to said first direction.

24. A process for forming an integrated circuit, comprising:
  (a) forming a plurality of semiconductor devices with a substrate, said semiconductor devices organized in a plurality of function blocks;
  (b) interconnecting said semiconductor devices within each function block thereby forming a respective function block circuit within each respective function block, where each function block has at least one of an input or an output;
  (c) forming a function block interconnect structure independent of any channels dividing said function blocks including the steps of:
    (1) forming &fixed conducting layer substantially over a space occupied by said function blocks, said fixed conducting layer including a plurality of parallel segmented conductors, and wherein said fixed conducting layer further includes a plurality of pin connectors to respective ones of said inputs and outputs, said fixed conducting layer independent of any circuit ultimately formed by said function block interconnect structure;
    (2) forming at least an insulating layer, said insulating layer having vias therethrough coupled to respective segments formed by said plurality of parallel segmented conductors in said fixed conducting layer;
    (3) forming a customized conducting layer, wherein at least a portion of said customized conducting layer is formed within a plurality of parallel tracks and over said space occupied by said function blocks, and at least a second portion of said customized conducting layer is in electrical communication with at least some of said vias.

25. The process of claim 24, wherein said step of forming a customized conducting layer includes a single mask step.

26. The process of claim 24, wherein steps (a)–(c)(1) each include predefined mask steps and wherein step (c)(3) includes a customized mask step.

27. The process of claim 26, wherein step (c)(2) includes a customized mask step.

28. The process of claim 24, further including, between steps (c)(2) and (c)(3), the step of storing the device formed by steps (a) through (c)(1).

29. The semiconductor chip of claim 8, wherein any of said first insulating layer, said prefabricated fixed conducting layer, said second insulating layer, and said customized conducting layer is also adjacent to said at least one conducting layer, said first insulating layer, said prefabricated fixed conducting layer, and said second insulating layer, respectively.

30. The semiconductor chip of claim 15, wherein any of said first insulating layer, said fixed conducting layer, said second insulating layer, and said customized conducting layer is also adjacent to said at least one prefabricated conducting layer, said first insulating layer, said fixed conducting layer, and said second insulating layer, respectively.

31. The semiconductor chip of claim 17, wherein any of said first insulating layer, and said prefabricated fixed conducting layer is also adjacent to said at least one prefabricated conducting layer and said first insulating layer, respectively.

32. The process of claim 24, wherein steps (c)(1) to (c)(3) are performed sequentially.

33. The process of claim 25, wherein said insulating layer is formed adjacent to said fixed conducting layer and to said customized conducting layer.

34. The semiconductor chip of claim 4, wherein at least some of the plurality of pin connectors are in communication with the customized conducting layer.

35. The semiconductor chip of claim 9, wherein at least some of the plurality of pin connectors are in communication with the customized conducting layer.

* * * * *

UNITED STATES PATENT AND TRADEMARK OFFICE
CERTIFICATE OF CORRECTION

PATENT NO. : 6,242,767 B1
DATED : June 5, 2001
INVENTOR(S) : How et al.

It is certified that error appears in the above-identified patent and that said Letters Patent is hereby corrected as shown below:

Column 11,
Line 53, before "independent", please delete "laver" and substitute therefor -- layer --.
Lines 54, 56 and 57, after "conducting", please delete "laver" and substitute therefor -- layer --.
Line 58, after "insulating", please delete "laver" and substitute therefor -- layer --.

Column 15,
Line 55, after "forming", please delete "&" and substitute therefor -- a --.

Signed and Sealed this

Twenty-first Day of May, 2002

Attest:

Attesting Officer

JAMES E. ROGAN
Director of the United States Patent and Trademark Office